United States Patent
Savoy et al.

(10) Patent No.: US 9,252,175 B2
(45) Date of Patent: *Feb. 2, 2016

(54) METHOD FOR ASSEMBLY OF SPECTROSCOPIC FILTER ARRAYS USING BIOMOLECULES

(75) Inventors: Steve M. Savoy, Austin, TX (US); Daniel R. Mitchell, Austin, TX (US); Jeremy J. John, Austin, TX (US); Byron G. Zollars, Georgetown, TX (US); George L. Murphy, Austin, TX (US)

(73) Assignee: Nanohmics, Inc., Austin, TX (US)

( * ) Notice: Subject to any disclaimer, the term of this patent is extended or adjusted under 35 U.S.C. 154(b) by 1222 days.

This patent is subject to a terminal disclaimer.

(21) Appl. No.: 13/069,928

(22) Filed: Mar. 23, 2011

(65) Prior Publication Data

US 2012/0241590 A1    Sep. 27, 2012

(51) Int. Cl.
| | |
|---|---|
| *C12M 1/00* | (2006.01) |
| *C07H 21/02* | (2006.01) |
| *H01L 27/00* | (2006.01) |
| *B05D 5/06* | (2006.01) |
| *B44F 1/00* | (2006.01) |
| *G01N 21/25* | (2006.01) |
| *H01L 27/146* | (2006.01) |

(52) U.S. Cl.
CPC .... *H01L 27/14625* (2013.01); *H01L 27/14685* (2013.01)

(58) Field of Classification Search
USPC .............. 435/283.1; 536/23.1; 250/208.1; 356/414; 427/162; 156/67
See application file for complete search history.

(56) References Cited

U.S. PATENT DOCUMENTS

| | | | |
|---|---|---|---|
| 3,971,065 A | 7/1976 | Bayer | |
| 4,542,640 A | 9/1985 | Clifford | |
| 5,106,756 A | 4/1992 | Zaromb | |
| 5,411,709 A | 5/1995 | Furuki et al. | |
| 5,674,698 A * | 10/1997 | Zarling et al. | 435/7.92 |
| 5,807,701 A | 9/1998 | Payne et al. | |
| 5,837,832 A | 11/1998 | Chee et al. | |

(Continued)

FOREIGN PATENT DOCUMENTS

| | | |
|---|---|---|
| WO | 0100876 | 1/2001 |
| WO | 02103371 | 12/2002 |

(Continued)

OTHER PUBLICATIONS

Cortie et al, Plasmonic heating of gold nanoparticles and its exploitation, 2005, Proceedings of SPIE, 5649, 565-573.*

(Continued)

*Primary Examiner* — Narayan Bhat
(74) *Attorney, Agent, or Firm* — George L. Murphy; Murphy Strategic IP (57) ABSTRACT

Spectroscopic filter arrays and methods for making spectroscopic filter arrays are provided. The arrays are formed using a dispersion of filter particles having selected moieties attached to the surface of the particles and a microarray having complementary moieties formed in an array on a substrate, such that each filter particle is attached to a selected region of the microarray. The moiety on the substrate may be RNA or DNA or other molecule. The substrate may be a surface of a photodetector array, a transparent plate that may be placed in registration with the photodetector or a stamp used to transfer the filter array to a photodetector array.

25 Claims, 7 Drawing Sheets

(56) References Cited

U.S. PATENT DOCUMENTS

| | | |
|---|---|---|
| 5,936,730 A | 8/1999 | Foley et al. |
| 6,268,222 B1 | 7/2001 | Chandler et al. |
| 6,326,108 B2 | 12/2001 | Simons |
| 6,327,410 B1 | 12/2001 | Walt et al. |
| 6,391,562 B2 | 5/2002 | Kambara |
| 6,426,184 B1 | 7/2002 | Gao et al. |
| 6,432,360 B1 | 8/2002 | Church |
| 6,479,297 B1 | 11/2002 | Sandhu |
| 6,567,163 B1 | 5/2003 | Sandstrom |
| 6,620,584 B1 | 9/2003 | Chee |
| 6,649,403 B1 | 11/2003 | McDevitt et al. |
| 6,689,321 B2 | 2/2004 | Sandhu |
| 6,787,308 B2 | 9/2004 | Balasubramanian et al. |
| 6,833,601 B2 | 12/2004 | Murakami |
| 6,849,239 B2 | 2/2005 | Morris |
| 7,034,941 B2 | 4/2006 | Chen et al. |
| 7,118,900 B2 | 10/2006 | Seul et al. |
| 7,167,309 B2 | 1/2007 | Saxena et al. |
| 7,182,916 B2 | 2/2007 | Noda et al. |
| 7,211,654 B2 | 5/2007 | Gao et al. |
| 7,297,497 B2 | 11/2007 | Montagu et al. |
| 7,335,153 B2 | 2/2008 | Seul et al. |
| 7,460,958 B2 | 12/2008 | Walsh et al. |
| 7,491,680 B2 | 2/2009 | Gao et al. |
| 7,544,638 B2 | 6/2009 | Gao et al. |
| 7,553,958 B2 | 6/2009 | Gao et al. |
| 7,585,664 B2 * | 9/2009 | Chan et al. ............ 435/287.2 |
| 7,838,466 B2 | 11/2010 | Gao et al. |
| 2002/0018199 A1 | 2/2002 | Blumenfeld et al. |
| 2002/0028455 A1 | 3/2002 | Laibinis et al. |
| 2002/0146745 A1 | 10/2002 | Natan et al. |
| 2003/0040129 A1 | 2/2003 | Shah |
| 2003/0118595 A1 | 6/2003 | Niemeyer et al. |
| 2004/0038307 A1 | 2/2004 | Lee et al. |
| 2004/0072274 A1 | 4/2004 | Lebrun |
| 2004/0121339 A1 | 6/2004 | Zhou et al. |
| 2004/0248144 A1 | 12/2004 | Mir |
| 2005/0032060 A1 | 2/2005 | Shah et al. |
| 2005/0053949 A1 | 3/2005 | Silin |
| 2005/0095649 A1 | 5/2005 | Aebersold et al. |
| 2005/0130174 A1 | 6/2005 | Bao et al. |
| 2006/0068504 A1 | 3/2006 | Kogi |
| 2006/0252070 A1 | 11/2006 | Boege et al. |
| 2007/0015213 A1 | 1/2007 | Mutz et al. |
| 2007/0224616 A1 | 9/2007 | Gulari et al. |
| 2007/0263914 A1 | 11/2007 | Tibbetts |
| 2008/0146459 A1 | 6/2008 | Iwakura et al. |
| 2008/0160316 A1 | 7/2008 | Samson et al. |
| 2008/0241951 A1 | 10/2008 | Battulga et al. |
| 2008/0293591 A1 | 11/2008 | Taussig et al. |
| 2008/0312105 A1 | 12/2008 | Bacher et al. |
| 2009/0018027 A1 | 1/2009 | Ronald et al. |
| 2009/0036324 A1 | 2/2009 | Fan et al. |
| 2009/0086064 A1 | 4/2009 | Mackey |
| 2009/0153864 A1 | 6/2009 | Kim et al. |
| 2009/0211437 A1 | 8/2009 | Fleischer et al. |
| 2012/0015833 A1 * | 1/2012 | Kotsbak ............ 506/7 |
| 2012/0038972 A1 * | 2/2012 | Gibson et al. ............ 359/296 |
| 2013/0230913 A1 * | 9/2013 | Florescu ............ G01N 21/253 435/288.7 |

FOREIGN PATENT DOCUMENTS

| | | |
|---|---|---|
| WO | 03079401 | 9/2003 |
| WO | 03095469 A1 | 11/2003 |
| WO | 03102546 | 12/2003 |
| WO | 2005030978 | 4/2005 |
| WO | 2005103718 A1 | 11/2005 |
| WO | 2006116726 | 11/2006 |
| WO | 2006124089 | 11/2006 |
| WO | 2007139849 | 12/2007 |
| WO | 2008027571 | 3/2008 |
| WO | 2008033848 | 3/2008 |
| WO | 2008082713 | 7/2008 |

OTHER PUBLICATIONS

Martin Alberti, "Biomolecular self-assembly of micrometer sized silica beads on patterned glass substrates", Applied Surface Science journal, May 3, 2009, pp. 7759-7765, issue 255.

A. Paul Alivisatos, "Organization of 'nanocrystal molecules' using DNA", Letters to Nature journal, Aug. 1996, vol. 382, pp. 609-611.

Rashid Bashir, "DNA nanobiostructures", Materials Today journal, Nov./Dec. 2001, pp. 30-39.

A. Csaki, "DNA monolayer on gold substrates characterized by nanoparticle labeling and scanning force microscopy", Oxford University Press, Nucleic Acids Research journal, 2001, vol. 29, No. 16 e81.

David S. Dandy, "Array feature size influences nucleic acid surface capture in DNA microarrays", PNAS, May 2007, vol. 104, No. 20, pp. 8223-8228.

R.L. Edelstein, "The BARC biosensor appliet to the detection of biological warfare agents", Biosensors & Bioelectronics, vol. 14, 2000, pp. 805-813.

Jiyun C. Huie, "Guided molecular self-assembly: a review of recent efforts", Smart Materials and Structures, vol. 12, 2003, pp. 264-271.

Ivanov et al., "Antibodies immobilized as arrays to profile protein post-translational modifications in mammalian cells", Molec. Cellular Proteomics 3.8:788-795, 2004.

Kozak et al., "Improving the signal-to-noise performance of molecular diagnostics with PEG-lysine copolymer dendrons", Biomacromolecules 10:360-365, 2009.

McNally et al., "Self-assembly of micro- and nano-scale particles using bio-inspired events", Applied Surface Science, 214:109-119, 2003.

Niemeyer et al., "Combination of DNA-directed immobilization and immuno-PCR:very sensitive antigen detection by means of self-assembled DNA-protein conjugates", Nucl. Acids Res., 31(16):e90, 2003.

Park et al., "Array-based electrical detection of DNA with nanoparticle probes", Science, 295:1503-1506, 2002.

Platt et al., "Aptamer evolution for array-based diagnostics", Anal. Biochem. 390:203-205, 2009.

Schroder et al., "Addressable microfluidic polymer chip for DNA-directed immobilization of oligonucleotide-tagged compounds", Small, 5(13):1547-1552, 2009.

McCauley et al., "Aptamer-based biosensor arrays for detection and quantification of biological macromolecules", Anal. Biochem. 319(2):224-250, 2003.

Stadler et al., "Multifunctional CMOS microchip coatings for protein and peptide arrays." J Proteome Res. 6(8):3197-3202, 2007.

Oleinikov et al., "Self-assembling protein arrays using electronic semiconductor microchips and in vitro translation". J Proteome Res. 2(3):313-319, 2003.

Chabra et al. "Spatially-addressable multiprotein nanoarrays templated by aptamer-tagged DNA nanostructures", J Am. Chem. Soc., 129(34):10304-10305, 2007.

Affymetrix, website, "Affymetrix Microarray Solutions".

Nimblegen, website, "Array Synthesis"p. 1-3.

Integrated DNA Technologies, website, "About IDT".

Wikipedia, "DNA Microarray"Jan. 5, 2011.

Office Action issued in U.S. Appl. No. 13/070,077, mailed Jun. 5, 2012.

Office Action issued in U.S. Appl. No. 13/070,077, mailed Aug. 7, 2012.

Office Action issued in U.S. Appl. No. 13/070,077, mailed Dec. 26, 2012.

Office Action issued in U.S. Appl. No. 13/070,077, mailed Feb. 7, 2013.

Office Action issued in U.S. Appl. No. 13/070,077, mailed Apr. 4, 2013.

Office Action issued in U.S. Appl. No. 13/070,077, mailed Apr. 23, 2014.

Office Action issued in U.S. Appl. No. 13/070,077, mailed Nov. 6, 2014.

(56) References Cited

OTHER PUBLICATIONS

Office Action issued in U.S. Appl. No. 13/070,077, mailed Mar. 19, 2015.

* cited by examiner

METHOD FOR ASSEMBLY OF SPECTROSCOPIC FILTER ARRAYS USING BIOMOLECULES

STATEMENT REGARDING FEDERALLY SPONSORED RESEARCH OR DEVELOPMENT

The invention was supported, in whole or in part, by Contracts FA8650-05-M-1893 and FA8650-06-C-1016 from the Air Force Office of Scientific Research and by Grant 1R43GM076859-01 from the National Institutes of Health, National Institute of General Medicine Studies. The U.S. Government has certain rights in the invention.

BACKGROUND OF THE INVENTION

1. Field of the Invention

The present invention relates to the field of photodetector array devices. More particularly, methods are provided for placing arrays of spectroscopic filter material on photodetector arrays such as image sensors and focal plane arrays.

2. Background of the Invention

Compact, low-cost digital imaging systems that combine the benefits of high spatial and spectral resolution are in demand for the next generation of analytical and surveillance instruments. Advances in commercial image sensors ("camera chips") and infrared focal plane arrays have led to picture element ("pixel") densities with very high spatial resolution. Despite pixel densities sufficient to resolve ultrafine features with large fields of view, commercially available color CMOS and CCD cameras are still limited in the degree of spectral (chromatic) resolution. Likewise, spectroscopic imaging outside the visible spectrum, either in the ultraviolet or the infrared is rarely accomplished at the photodetector level. Instead, spectral resolution of color imaging systems is generally restricted to the Bayer red-green-blue (RGB) color filter array (CFA) mosaic pattern found on virtually all color image cameras. These color cameras are designed to meet minimal color reproduction requirements for digital photography, but are in no way optimum, for example, in bioanalytical instrumentation used to perform medical or scientific analyses. In typical instrumentation, more precise definition of spectral bands is achieved with a combination of a gray-level monochrome image sensor and one or more dispersive or absorptive filter elements that are bulky and expensive, particularly when motorized switching between filter sets is employed. Likewise, electronically-tunable filters (e.g. LCD, acousto-optic, Fabry-Perot, etc.) reduce image acquisition speed and do not yield high spectral fidelity or efficient light throughput. Elimination of external dispersive elements and slow tunable filters requires directly integrating higher spectral definition into the mosaic pattern on the surface of the photodetector array, which may be silicon CMOS/CCD in the ultraviolet and visible spectral range, InGaAs in the near infrared radiation (NIR) range and short wave infrared radiation (SWIR) range, InSb in the mid wave infrared radiation (MWIR) range and HgCdTe in the long-wave, or far infrared radiation (LWIR) range. The photodetector array may not be an array of photodiode pixels and may consist of arrays of bolometer or pyroelectric detectors, for example. In addition, the photodetector array may be a structured ensemble or layered arrangement of discrete detectors or photodetector arrays, perhaps sensitive to wavelengths in a variety of spectral bands.

What is needed is a process for expanding the number of detected spectral intervals, and increasing spectral resolution, spectral range, and sensitivity dynamic range of photodetector arrays through batch assembly of filter arrays directly on the surface of the photodetector array, or onto a substrate or stamp that can be either applied to or used to transfer the filter array to the photodetector array surface.

BRIEF SUMMARY OF THE INVENTION

A method of manufacture using biomolecular binding forces to assemble micro- and nanoscale structures into an array of functional spectroscopic filters is provided. Precisely positioned functional filter elements at specific locations in an array may be formed by binding of complementary biomolecules that carry filter particles to anchored biomolecules on addressable regions of a photodetector array surface. Biomolecular binding directs the filter particles to specific array locations during a batch binding step. Multilayers of registered micro- or nanoscale particles may also be fabricated.

BRIEF DESCRIPTION OF THE DRAWINGS

The invention may be better understood by reference to one or more of these drawings in combination with the detailed description of specific embodiments presented herein.

DETAILED DESCRIPTION OF THE INVENTION

A method for using the principles of microarrays in a different technology to construct functional, mechanical devices is disclosed herein. In a preferred embodiment of the invention, nucleic acid, or DNA microarrays are used to fabricate filter particle arrays through biomolecule-guided assembly of the filter particles to specific regions of the microarray. Biomolecule-guided assembly of filter particles is performed by first synthesizing or otherwise fabricating a microarray.

Microarrays, or "arrays," are well known and widely used in molecular biology. Arrays used in embodiments of the invention can be, for example, arrays of proteins, peptides, antibodies, antigens, aptamers, nucleic acids, ligands, receptors, chemical compounds, or arrays of other biomolecules. Numerous examples of how to make these types of arrays and useful substrate surfaces can be found in Platt et al., 2009; Chabra et al., 2007; McCauley et al., 2003; Ivanov et al., 2004; Stadler et al., 2007; Oleinikov et al., 2003; U.S. Pat. No. 7,297,497; U.S. Publication Nos. 2004/0072274, 2007/

0015213, 2004/0038307, 2005/0095649, 2008/0293591, 2009/0018027, as well as WO 2003/095469A1. Microarrays entail binding between anchored probe biomolecules that are coupled to a surface and target, or complement biomolecules. A type of microarray is a DNA or an RNA microarray. DNA microarrays consist of an arrayed series of thousands of microscopic areas of DNA oligonucleotides, each containing a specific DNA sequence—called an anchored probe. Hybridization between anchored probe biomolecule sequences and complementary target sequences in solution is detected by various ways to indicate the relative abundance of nucleic acid target sequences in the sample. Methods and apparatuses for preparing DNA microarrays are well known in the art. DNA microarrays are commercially available from numerous providers.

Figure 1:
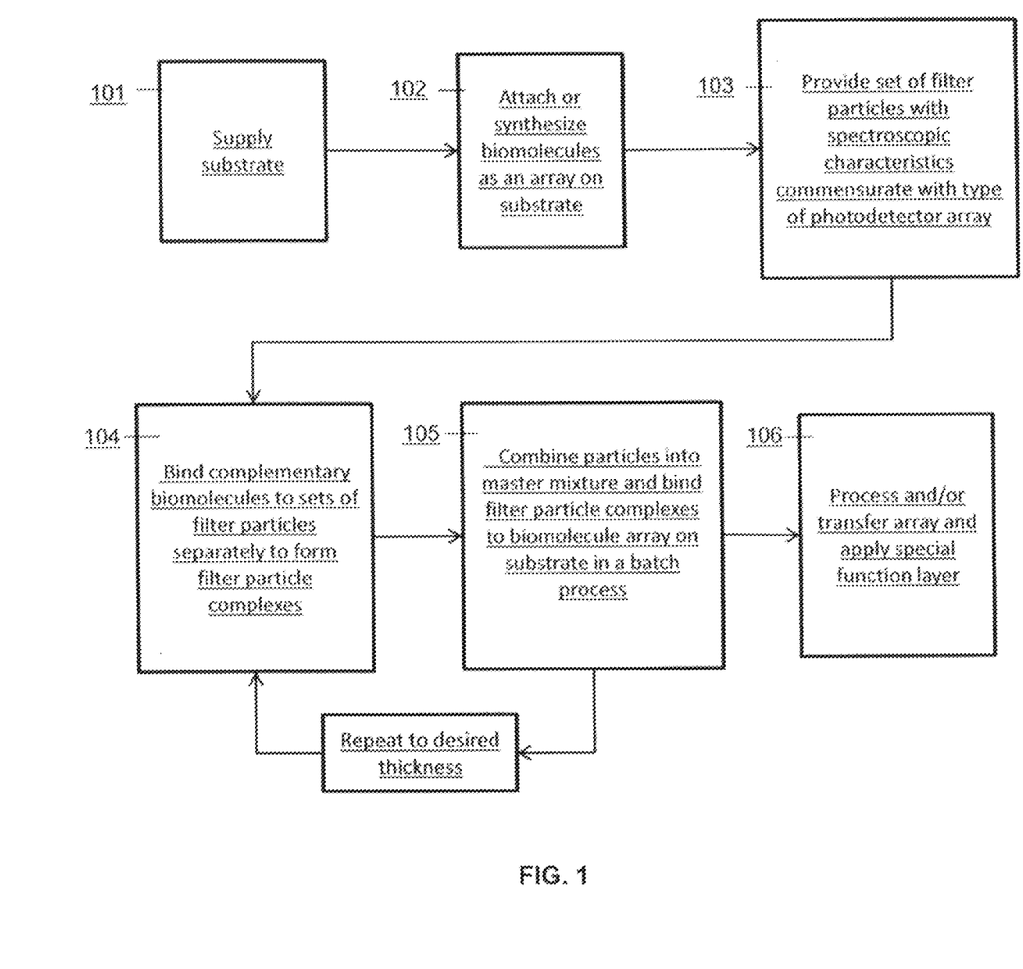
FIG. 1 illustrates the process for making filter particle arrays using a biomolecular assembly process.

Referring to FIG. 1, methods for using the binding properties of biomolecular arrays to manufacture a spectroscopic filter array device is illustrated. In this process, a substrate is supplied in step 101. The substrate may be a photodetector array such as a commercial image sensor or focal plane array, for example. Alternatively, the substrate may be a glass or other transparent plate that is non-interacting with the full range of spectral bandpass of the filter array. In another embodiment, the substrate may be an intermediate transfer stamp used to assemble the array and transfer the assembled array to a second substrate such as a photodetector array. In step 102, an array of biomolecules is formed on the substrate from step 101. Multiple methods are known in the art for populating biomolecules onto surfaces into arrays including methods that involve spotting oligonucleotide or peptide sequences, or alternatively synthesizing oligonucleotides or peptides in situ via single nucleotide or amino acid coupling.

By way of example, the method of Photo-Generated Reagent (PGR) provided in U.S. Pat. Nos. 6,426,184; 7,491,680; 7,544,638; and 7,838,466; and U.S. Patent App. Pub. No. 2007/02246216 may be used. A microfluidic device cover is placed over the supplied substrate. The device includes many reaction chambers, which are sized and arranged so as to register with the image sensor array to which the filter is to be applied. Photo-generated reagent is formed by illumination with light in specific fluid compartments throughout the array. Light provides a means to activate a chemical process that results in acid generation, which enables synthesis of part of a DNA molecule when a nucleotide solution flows across the array in a subsequent step. Areas where no light exposure occurs do not react in that step. The process is repeated until each array area is populated with sequences of biomolecules, referred to as anchor probes. Because the position of the light illumination is chosen during manufacture of the array, the sequence of each anchor probe in the collective set in the array is known and recorded as a library of the anchor probes.

Because the sequences of the set of anchor probes are known for each position in the array, complementary binding sequences to those probes are used to direct the attachment of filter particles to specific locations in the array from the dispersion of filter particles supplied in step 103. In embodiments of the invention, a filter particle may comprise a "bead" or "polymer sphere" or "microsphere" that is capable of being "dyed" or "colored" or enriched with other smaller particles or pigments that can alter the spectroscopic properties of the particle core. Core modification may include covalent coupling of molecular dye molecules, nanoparticles, ionic complexes and other electromagnetically-active moieties in such a fashion that the particle acts as a carrier of the spectroscopic-selective pigment.

In other non-limiting examples, the particle may consist of a block co-polymer bearing a pendant dye molecule that is incorporated during synthesis of the particle, or physical partition of the dye, or pigment by hydrophobic swelling and core diffusion. Core-dyed microspheres are available from a number of vendors, with custom swelling and dying processes readily available (e.g. Bangs Laboratories; Fishers, Ind., USA, www.bangslabs.com). Suitable compositions of polymer beads are numerous and will vary depending on the application and whether or not an additional particle is attached to the bead. U.S. Pat. Nos. 6,268,222; 6,327,410; and 7,335,153, U.S. Publication Nos. 2002/0146745 and 2006/0068504, and PCT Publication No. WO/2002/103371 describes numerous non-limiting examples of bead and particle compositions suitable for embodiments of the invention.

In other embodiments, the pigment may be colored, ultraviolet- or visible-absorbing, or fluorescent nanoparticles may be covalently coupled or physically partitioned into the core of the polymer microsphere. In still other aspects of the invention, chemical group vibrational absorption may impart differential spectroscopic filter properties in the MWIR. Spectral selection in the LWIR range may be thermally or bolometrically detected by concentrating varying amounts of molecules with specific vibrational wavelengths within the particles. Further still, spectroscopic altering particles such as lanthanide-doped yttrium oxide upconverting phosphors that absorb infrared radiation and re-emit to shorter wavelengths may be present in the particles.

Particles, beads, spheres, or microspheres need not be spherical. Particles may be of any geometrical shape or may be irregularly shaped. Particles may also be solid, hollow, or porous and may be composed of more than one material or substance or numerous layers of substances. Particle sizes may range from nanoscale, on the order of nanometers (e.g., less than or equal to about 100 nm), to millimeter scale (e.g., less than or equal to about 1 mm). In embodiments of the invention, particles of mixed sizes may be used for making a filter particle array. By way of example, U.S. Pat. Nos. 6,327,410 and 7,335,153, and U.S. Publication Nos. 2002/0146745 and 2006/0068504 describe numerous bead and particle compositions and sizes suitable for embodiments of the invention.

In all embodiments, the microsphere is modified, derivatized, or functionalized with the dye or pigment or spectrally-selective molecule so as to be capable of interacting with select spectroscopic regions of electromagnetic radiation relative to the whole spectrum. The range is not limited to any particular region of electromagnetic radiation, provided a suitable spectroscopic interaction is imparted by the assembled filter particle array.

Assembly of filter particle arrays shown in FIG. 1 step 104 begins with attaching complementary sequences to particles, thereby forming a "filter particle complex." As used herein, the term "filter particle complex" refers to filter particles having a moiety attached thereto that mediates binding to a complementary moiety on a surface. In the present embodiment, a binding moiety comprises a nucleic acid that is complementary to a nucleic acid of a nucleic acid array on the substrate supplied in step 101. In other non-limiting examples, a binding moiety may comprise biotin, streptavidin, or another chemical entity capable of interacting with a complementary entity of an array on a surface.

In certain embodiments of the invention, a filter particle complex comprises a filter particle attached directly to a binding moiety. Non-limiting examples of direct binding include nucleic acid fragments, polynucleotides, oligonucleotides, proteins, peptides, ligands, receptors, antigens, antibodies, and individual members of biological binding pairs. In other embodiments, a filter particle complex comprises a linking structure that connects the particle to the binding moiety. For example, a filter particle may be attached directly to a nucleic acid or through a linking moiety such as a terminal amine or carboxylate group, or through multiple linking moieties, such as, for example, biotin and streptavidin. Methods for the attachment of various binding moieties to particles are known in the art (see e.g., U.S. Publication Nos. 2002/0028455 and 2002/0146745 and U.S. Pat. No. 6,327,410).

Once individual complementary sequences specific to anchor probes in the array are coupled to the surface of individual filter particles, a subset of particles for each type of filter particle is combined into a master mixture or dispersion of multiple types of filter particles (FIG. 1. step 105). This dispersion contains all of the filter particle elements that are desired for manufacture of a particular pattern of a filter particle array. In step 105, exposure of the dispersion of particles to the anchor probe microarray on the substrate will lead to assembly of each filter particle element into the pre-designed pattern, or mosaic pattern. This occurs during a single batch step, regardless of the dimensions of the array. The assembly process may be repeated as needed with yet a further set of filter particles that is complementary to the first set of particles to increase the thickness of the filter particle array.

As a final measure illustrated in step 106, post processing steps such as washing to remove non-assembled particles, annealing and addition of special function layers such as spin-on of a final index matching fluid or optical cement, for example, will provide the final structure of the filter particle array. If the chosen substrate is an image sensor or glass slide that is inverted and applied to the surface of the image sensor, the filter particle array pattern can impart any combination of enhanced spectral selectivity, expanded spectral range, and expanded sensitivity dynamic range to the device compared to existing methods for fabricating filter arrays known in the art.

Figures 2A, 2B:
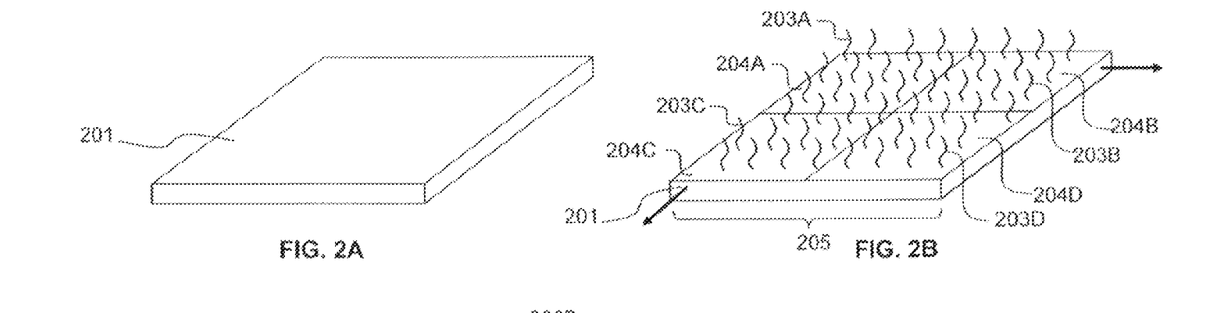
FIGS. 2A, 2B, 2C, 2D and 2E are isometric views showing an example of a filter particle array at various stages of assembly.

FIG. 2A shows substrate 201, upon which a nucleic acid array can be synthesized. The substrate may comprise a photodetector array where the nucleic acid array is synthesized directly onto the surface of individual photodetector elements, for example. In another embodiment, the substrate may comprise a material with special function such as a glass slide for optical transparency. The filter array on a special function substrate may be joined with the photodetector array by positioning the filter array in contact with, and registered to, the photodetector array. In another embodiment, the substrate may comprise a stamp that can be used to transfer the pattern in a subsequent step. Substrate 201 may include any number of layers that may be used to enhance or protect the response of the photodetector relative to the filter.

In the embodiment where the filter array is deposited directly on the photodetector array, it may be present on the entire array surface or on selected regions of the photodetector array. In most embodiments, the filter array is registered one-to-one with each pixel in the photodetector array. However, one-to-one registration, defined as the condition when the spatial area covered by filter particles of a single type corresponds exactly with the area of a single photodetector pixel, is not required. Alternate embodiments include a single filter particle array region that is registered to multiple photodetector pixels and need not have square dimensions.

Figure 2C:
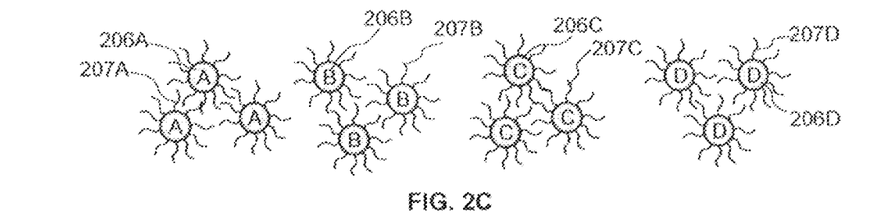
Figure 2D:
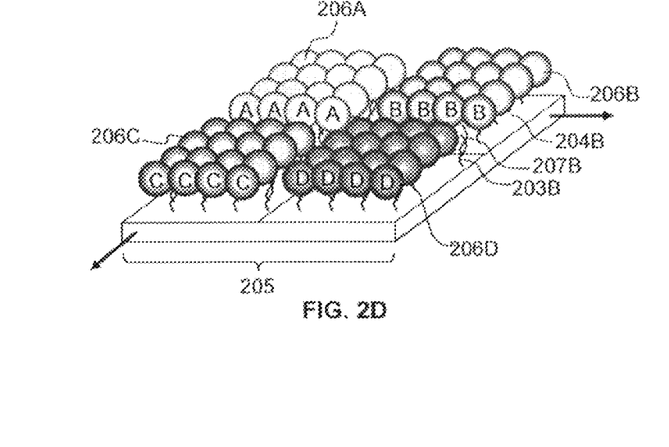

FIG. 2B shows distinct, arrayed nucleic acid sequences 203A-D, the "microarray", attached to substrate 201 that defines addressable regions 204A-D of a "unit cell" 205 of the filter particle array. Filter particle complexes, shown in FIG. 2C, have filter particles 206A-D with each particle type having nucleic acids 207A-D that are complementary to nucleic acids 203A-D in one section of unit cell 205. FIG. 2D shows the assembled unit cell 205 following hybridization of complementary nucleic acids 207A-D on filter particles 206A-D to the anchored nucleic acids 203A-D in the microarray. For clarity, the nucleic acids on particles that do not participate in hybridization to the microarray are not depicted in the diagram. Such nucleic acids are available for binding additional particles in subsequent steps of filter particle array assembly.

During assembly, it is preferred to employ varying conditions of hybridization to achieve varying degrees of selectivity of nucleic acid 207 toward anchored nucleic acid 203. In a non-limiting example, hybridization of a related nucleic acid that does not hybridize to a complementary or partially complementary nucleic acid under stringent conditions may be achieved by hybridization at low temperature and/or high ionic strength. Such conditions are termed "low stringency" or "low stringency conditions," and non-limiting examples of low stringency include hybridization performed at about 0.15 M to about 0.9 M NaCl at a temperature range of about 20° C. to about 50° C. Because hybridization sequences 203 are predefined and not constrained to any particular sequence such as required for DNA detection methods, selection can be made to minimize sequence hybridization interference. It is within the skill of one in the art to select appropriate non-interfering sequences and further modify the low or high stringency conditions to suit a particular application.

Figure 2E:
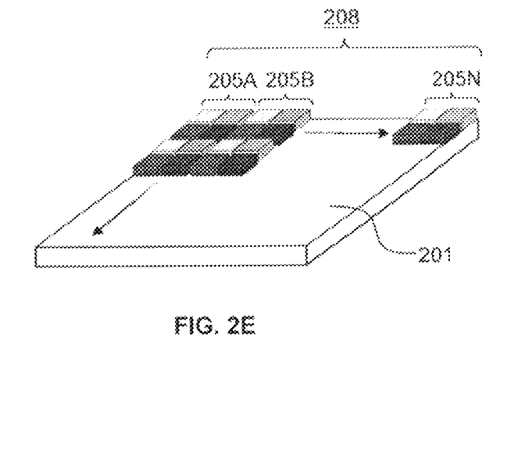

FIG. 2E shows how unit cell 205 can be repeated to form a larger filter particle array 208. The diagram illustrates filter particle array 208 comprising a series of filter particle subunit regions (i.e., "unit cells") 205A-N. The illustration depicts the stage following removal of the nucleic acids and after other potential conditioning steps such as heating, reflowing, chemical fusion or addition of a continuity layer, such as an index matching layer. For clarity, the collection of filter particles 206 for any given addressable region is represented schematically as flattened cubes or squares.

Figure 3A:
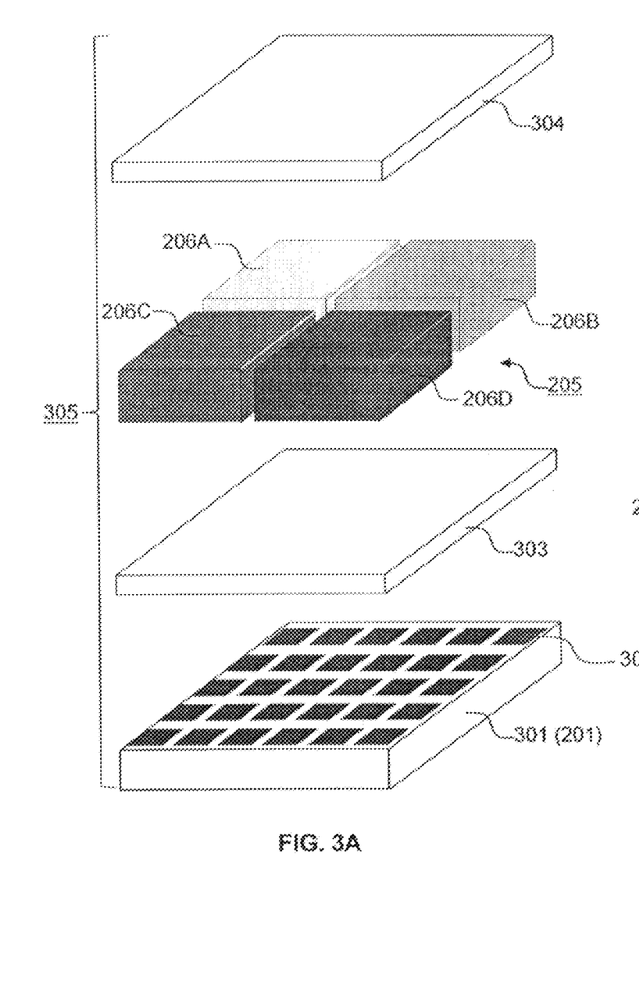
FIGS. 3A and 3B are isometric views showing different substrate embodiments.
Figure 3B:
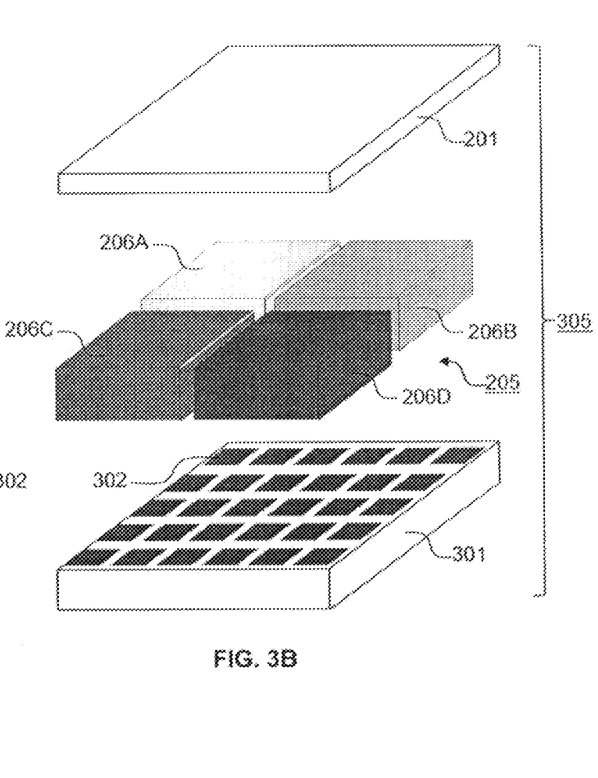

FIG. 3A illustrates the embodiment where filter particle array unit cell 205, consisting of filter particles 206A-D, is deposited on substrate 201 that comprises a photodetector array 301. Photodetector array 301 may consist of addressable detector elements 302 such as pixels of an image sensor or focal plane array. Alternatively, photodetector array 301 may be composed of an array of bolometers or pyroelectric detectors. An intermediate layer 303 such as a protective oxide coating or a registered array of refractive structures (lenslets) on photodetector array 301 may be included. Intermediate layer 303 may also consist of, for example, a custom linkage layer for attachment and positioning of nucleic acids above the surface of the photodetector array. As a final measure, a protecting outermost layer 304 may be used to complete the filter particle array assembly 305. Outermost layer 304 may protect the filter particle array from physical damage, or condition the filter particle array for a specific application such as matching the index of refraction to an external medium to decrease light reflection or scattering from individual particles. FIG. 3B illustrates an embodiment where filter particle array unit cell 205 is deposited first on substrate 201, shown at the top of the stack. As an example, substrate 201 can be a material such as a transparent glass or quartz plate for image sensor applications. Numerous possibilities exist for the composition of substrate 201. In the embodiment depicted in FIG. 3B, filter particle array unit cell 205 would be arranged such that 205 would first be deposited on substrate 201, inverted, registered to, and placed in contact with photodetector array 301. The face of substrate 201 not having the filter particle array attached thereto would serve as the outermost layer of the assembled filter particle array device 305.

Figure 4A:
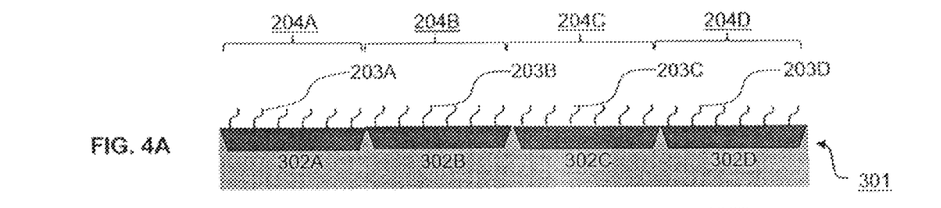
FIGS. 4A, 4B, 4C and 4D are cross-section views of a filter particle array made by the addition of different particles, represented by different shadings and sizes, during multiple attachment steps.
Figures 4B, 4C:
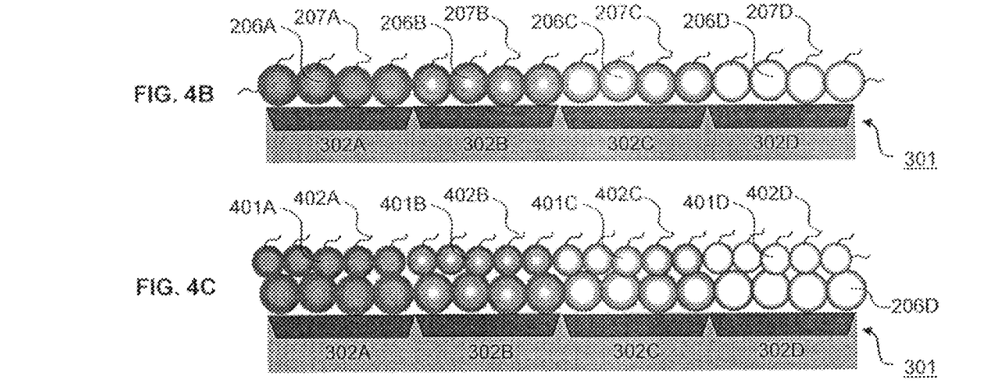
Figure 4D:
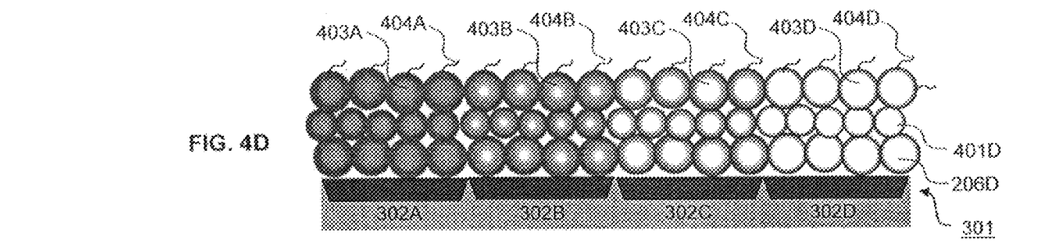

In some embodiments, attachment of filter particles 206 to photodetector array 301 bearing microarray 203A-D is performed more than once to form multilayers. This may involve repeatedly performing the hybridization step with the same type of particles so as to increase the number density of a specific type of particle 206 in filter particle array 208. In other embodiments, the hybridizing step is repeatedly performed with one or more different types of particles. All hybridizing steps may be repeated one or more times until the desired density of filter particles 206 is achieved. FIG. 4A shows a cross section view of photodetector array 301 having four addressable regions 204A-D consisting of four addressable detector elements 302A-D, each detector element having a distinct nucleic acid sequence represented by 203A-D that is attached to the surface of photodetector array 301 of FIG. 3. FIG. 4B shows the attachment of four different particle types 206A-D to each of the four addressable regions 204A-D. Nucleic acids 207A-D attached to filter particles 206A-D may mediate attachment of additional particles 401A-D bearing nucleic acids 402A-D that are complementary to nucleic acids 207A-D attached to particles 206A-D (FIG. 4C). FIG. 4D shows the further attachment of additional particles 403A-D in another hybridization step mediated by nucleic acids 404A-D complementary to nucleic acids 402A-D (FIG. 4C).

Figure 5:
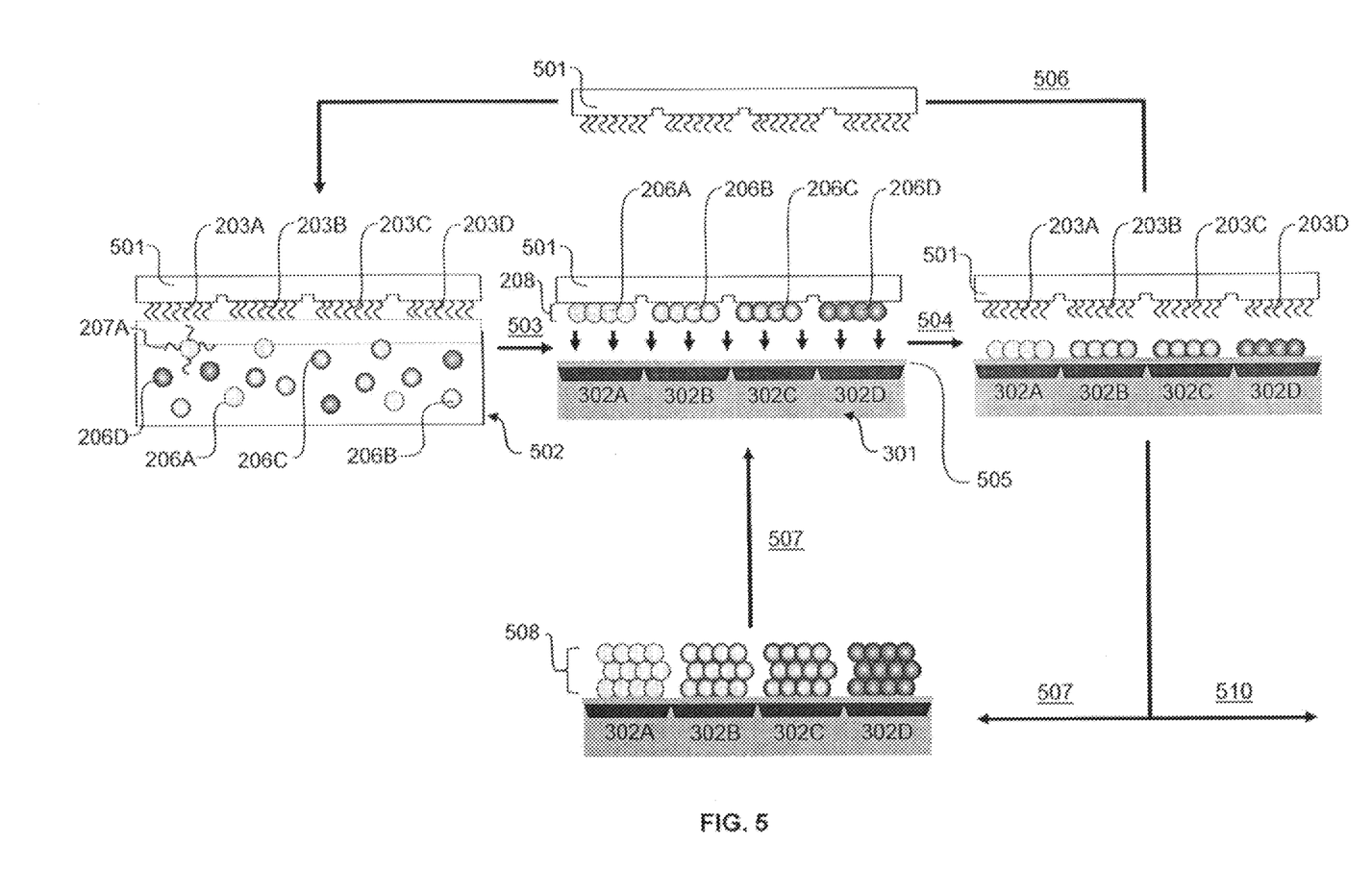
FIG. 5 is a schematic showing the process for using, a stamp substrate to assemble a filter particle array and transfer the array to addressable regions of a photodetector array.

In another embodiment, illustrated in FIG. 5, filter particle array 208 may be formed on a substrate which consists of transfer stamp 501. Transfer stamp 501 may be used to first assemble filter particle array 208, then transfer assembled filter particle array 208 to another substrate such as photodetector array 301. The process begins with the assembly of microarray 203A-D on transfer stamp 501. Transfer stamp 501 may have a planar surface, or may contain relief structure for assisting in release. Transfer stamp 501 is immersed in fluid vessel 502, which contains the dispersion of filter particles 206A-D bearing complementary nucleic acids 207A-D. Immersion of transfer stamp 501 results in assembly of filter particle array 208 on transfer stamp 501 via step 503. Transfer stamp 501 bearing filter particle array 208 can then be brought in contact with a second substrate such as photodetector array 301 illustrated in step 504. Photodetector array 301 may contain an adhesion, or linking layer 505 that promotes release and transfer of the assembled filter particle array to photodetector array 301 from transfer stamp 501. In a preferred embodiment, linking layer 505 is a thin adhesive that serves to seat assembled filter particle array 208 during contact.

Other methods for transferring a filter particle array may include encapsulation of the assembled array in a protective coating such as a hydrogel, or an oligosaccharide or polysaccharide coating, followed by stamping onto photodetector array 301 and subsequent removal of the hydrogel or coating, if desired. As a non-limiting example, ultra-low-melting temperature agarose is a thermo-reversible, physically cross-linked hydrogel that can be used for encapsulating and transferring an array. Following transfer to photodetector array 301, the agarose can be re-melted at 50-55° C. so as to release the filter particle array while retaining the integrity of filter particle array 208 and the activity of the filter particles.

In yet another example, a saccharide solution such as 1% trehalose may be dried or lyophilized onto the filter particle array 208 to maintain its integrity during transfer to another substrate. Rehydration following transfer can be used to remove the saccharide solution. In some aspects, it will be useful to rehydrate the saccharide in a solution that maintains hybridization between complementary nucleic acids.

In most transfer methods, it will be desirable to perform a denaturation step to facilitate release of hybridization. Hybridization release serves to separate the assembled particles by releasing the chemical energy in the hybridization bonding. Secondly, denaturation serves to keep the microarray intact for re-use and re-assembly of additional layers or depositing onto additional substrates. Upon melting or chemical denaturing of the hybridized DNA complex, assembled filter particle array 208 preferentially remains on photodetector array 301. Chemical denaturation may involve specific denaturing agents such as high salt, or low salt environments or other specific intercalants. Methods for controlled denaturation of hybridized nucleic acids are numerous and well known in the art.

Following denaturation of nucleic acids 207, and/or linking layer 505, the filter particle array will adhere in sine to the surface on which it was transferred. In the preferred embodiment, separation of stamp 501 from photodetector array 301 leaves an intact microarray 203 on the surface of transfer stamp 501. Stamp 501 can then be used in a repetitive manner to assemble additional filter particle arrays 208 as illustrated by step 506 in FIG. 5. This process could include the addition of multiple layers of the assembled filter particle array onto the same substrate. Deposition of repeated multiple layers onto photodetector array 301 is illustrated schematically in the cyclic process step 507. The schematic representing step 507 illustrates photodetector array 301 with three transferred layers of assembled filter particle array 208 forming filter particle array assembly 508.

Following transfer of a single, or multiple assembled filter particle array(s) 208 to photodetector array 301, the device may then receive final processing treatments including any special function layers such as protection or index-matching layers, step 510. At any point in the process removal of nucleic acids 203 or linking layer 505 may occur, if necessary. A number of chemical agents for degrading nucleic acids as well as high temperature exposure can lead to nucleic acid removal. The adhesive layer may be left intact in the final device setting or be removed by chemical degradation, treatment with irradiation such as UV irradiation, or burning or ashing in the case where the spectrally-selective pigment is tolerant to high temperatures and remains intact after processing.

Physical features present on the surface may maintain the integrity of the assembled filter particle array. The nature of the material interaction may provide sufficient structural integrity for the filter particle array to be separated from the substrate and function as a stand-alone film, either independent or assisted by a common layer that provides backing support. As non-limiting examples, this may include deposition of a common layer such as an index-matching film that partially, or entirely covers the filter particle array. An "index-matching material" or "refractive index matching film," is a substance that has an index of refraction that closely approximates that of an optical element and is used to reduce Fresnel reflection at the surface of the element. Index-matching material is usually a liquid, adhesive, or gel. For example, an index-matching layer may be used in methods of the invention to decrease reflectance of light incident on the particles of a light filter array. Index-matching material may be deposited on light filters of the invention by, for example, spin-coating techniques known in the art. Index-matching materials are commercially available (e.g., Newport Corp.; Irvine, Calif., USA and Cargille Labs; Cedar Grove, N.J., USA).

In all embodiments, it is desirable to maintain the functionality of the filter particles and the functionality and integrity of the filter particle array. As used herein "integrity" means whole, undivided, or undiminished. Alternatively, the array substrate or sections thereof may be surrounded by raised regions of the surface such that filter particles are physically constrained. Exemplary methods for the derivatization of substrates and particles for purposes of attachment of particles to surfaces are described in U.S. Pat. Nos. 6,327,410 and 7,335,153 and U.S. Publication Nos. 2004/0248144 and 2002/0146745. Filter particle arrays may be transferred to or from any type of surface. In this aspect, it is desirable that the act of transferring maintains the array integrity. In some aspects, transferring an array to a different surface may enhance the usefulness or operability of the array, and may increase the manufacturability, since the microarray template used to assembly the filter particle array may be repeatedly used to assemble and transfer filter particle arrays to multiple devices.

Figure 6:
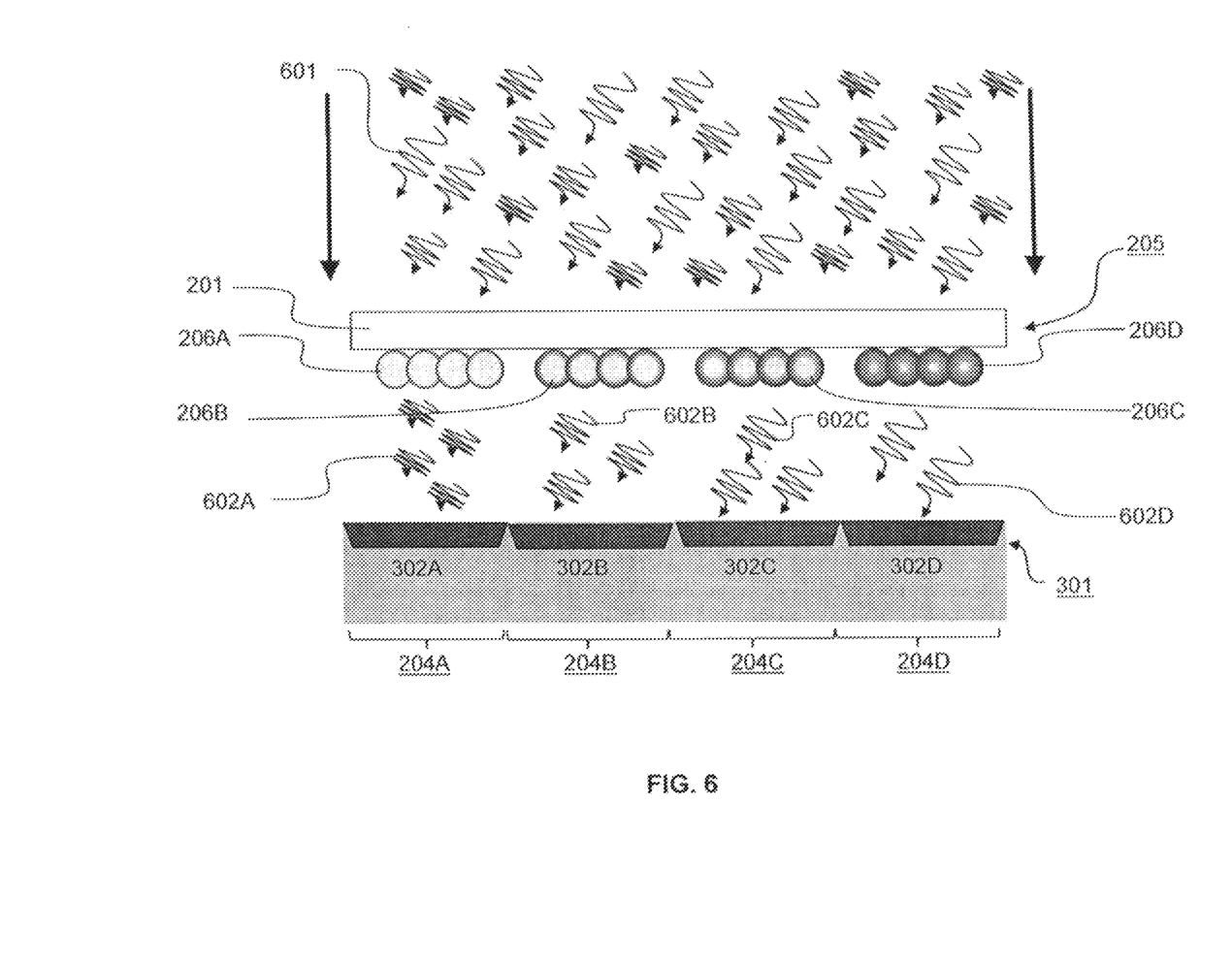
FIG. 6 is a cross-section view illustrating light filtering performed by a filter particle array having four different types of filter particles affixed at four addressable regions of the photodetector array. The filter particle array is detached from the substrate in the drawing to increase clarity.

Filter particle arrays that filter different wavelengths of electromagnetic radiation and methods for making and using spectroscopic filter arrays are illustrated in FIG. 6. A spectroscopic filter array functions to remove one or more wavelengths of electromagnetic radiation from a broad spectrum of radiation 601 passing through the filter. One example of a spectroscopic filter array is a color filter array (CFA). A CFA filters visible light by wavelength range such that certain wavelengths of light pass through specific regions of the CFA while other wavelengths are prevented from passing through those regions of the CFA. In some aspects, one or more wavelengths of light or a range of wavelengths may pass through certain regions of a filter array while other wavelengths of light or other ranges of wavelengths pass through other regions of the array. Therefore, a CFA may have one or more regions that removes or reduces specific wavelengths or colors of light from the spectrum and/or that provides a means for certain wavelengths or colors of light to traverse an array region. In another embodiment, a filter array may be constructed that filters different wavelengths of far infrared radiation, for example, a pattern on top of a HgCdTe detector array. The assembly method of the invention could be broadly applied to any portion of the electromagnetic spectrum provided particles are selected for interaction with the target radiation range.

FIG. 6 shows representations of a photodetector array 301 having four addressable detector elements 302A-D representing four addressable regions 204A-D. Spectroscopic filtering by unit cell 205 of filter particle array 208 that is composed of four unique filter particle elements 206A-D is illustrated in cross section. Filter particles 206A-D is shown attached to photodetector array 301. Broadband electromagnetic radiation 601 impinges on filter particle array unit cell 205. This assembly is represented in FIG. 3A, however the substrate with assembled filter particle array 208 is shown detached from photodetector array 301 for clarity. In practice, these two components would be in close contact. Particles 206A-D filter unwanted wavelengths of the broad spectrum 601, consistent with the pre-selected filter spectroscopic element in particles 206A-D, while providing a means for the passage of respective wavelengths 602A-D of broad spectrum 601. For example, particle 206A may pass only short wave radiation 602A (e.g. 300 nm light). This radiation would be the only component reaching the corresponding detector element 302A in addressable region 204A of photodetector array 301. Another assembled set of particles 206D, for example, would pass only longer radiation 602D (e.g., 1.5 µm), to detector element 302D in addressable region 204D and so on for other addressable filter particle array regions 204 in filter particle array unit cell 205. In practice, the level and range of filter selectivity is defined by the arrangement of unit cell 205, which may be repeated to form the mosaic pattern of filter particle array 208. The ability to create large and complex arrays with multiple constituents in the fashion presented by this invention is not known in the art.

Figure 7:
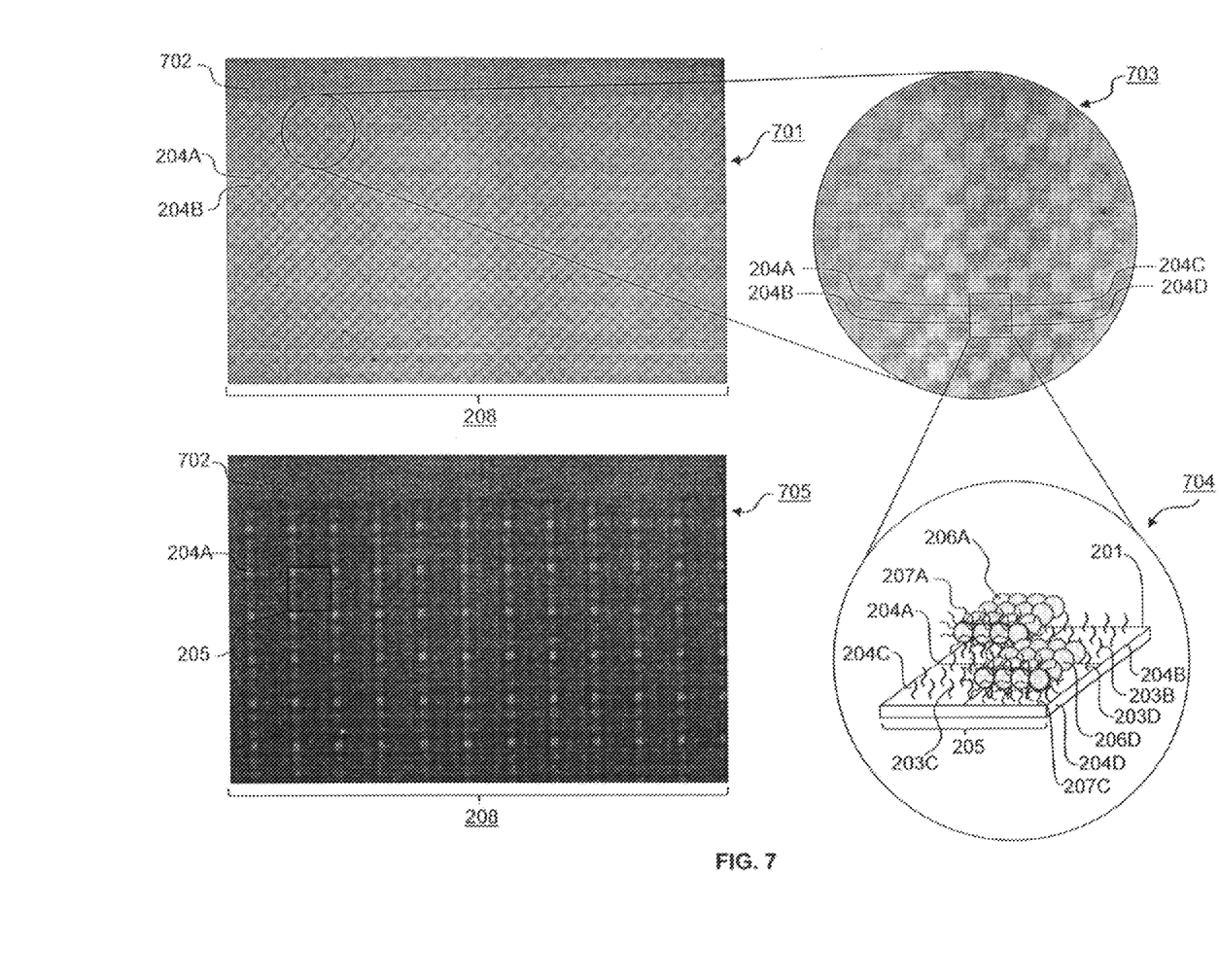
FIG. 7 is a photograph showing a specific example of nucleic acid-mediated assembly of polymer microsphere particles to specific regions of an addressable array.

FIG. 7 shows photographs of specific examples of polymeric microsphere particles that are localized at various regions in filter particle array 208. In this example, filter particle array 208 was assembled using a custom DNA microarray synthesized by Roche Nimblegen (www.nimblegen.com). Initially, microarray 701 was synthesized with anchored probe sequences 203A-D defined for specific regions 204A-D in the microarray. This method is one of many methods known in the art for microarray synthesis. Filter particle array 208 was formed on microarray 701 when filter particles 206 bound to specific regions 204A-N. In example 701, a 2×2 array is illustrated with two of the filter particle array regions, 204A and 204D having bound particles with different concentrations of core dying. A terminal edge of the array is also illustrated at the top of 701 where, in this specific example, full particle binding area 702 was encoded. Inset 703 shows unit cell 205 of filter particle array 208, composed of filter particle addressable regions 204A-D. The schematic diagram in inset 704 further illustrates unit cell 205, composed of addressable regions 204A-D. In the schematic, complementary sequences 207A-D, which were attached to polymer microsphere particles 206A-D, hybridized to anchored sequences 203A-D present in each array region 204A-D. Particle set 206A and 206D were localized in the example and regions 204B and 204C did not hybridize. For clarity, only the front row of particles 206 are depicted with complementary sequences 207. In practice, particles may be localized in any or all of the areas by combining individual particle sets 206A-N (N=any number of possible combinations) into a disperion of particles with requisite encoding sequences 207A-N and exposing the particles to microarray 701 in a batch process.

In the example shown in FIG. 7, localized particles 206 appear as shaded areas, e.g., 204A, of the addressable regions of filter particle array 208. This is contrasted with the lighter region 204C where no localization occurs during exposure. Photograph 705 shows a different array consisting of a 3×3 unit cell 205 that is repeated to form filter particle array 208. In this example, particles 206A-I bound to addressable regions 204A-I consisting of polymer microspheres that were core-dyed with fluorescence dyes and nanoparticles. Photograph 705 shows brightly shaded regions where the core dying was extensive. Other regions where particles with less concentration of fluorophore were localized can also be seen in the photograph. Addressable regions 204, where no complementary particles are bound, appear dark in the photograph. In this example, the edge of microarray 701 is depicted with a portion of non-array area 702 in view.

A filter particle array may be a Bayer CFA (U.S. Pat. No. 3,971,065). A Bayer CFA of the invention comprises an alternating pattern composed of one red, two green, and one blue filter, each covering a single image sensor. This type of pattern is referred to as a 2×2 pixel pattern, because the pattern has 4 pixels in a 2×2 arrangement. In other embodiments, filter particle arrays are made to have 3×3 pixel patterns, 4×4 pixel patterns, 5×5 pixel patterns and/or up to N×N pixel patterns, where N is limited by the number of addressable spots present on the nucleic acid array used for making the filter particle array. In still other aspects of the invention, filter particle arrays comprise one or more different pixel patterns. Expanding the size of the pixel pattern from a typical 2×2 pattern to a 3×3, 4×4, 5×5, or higher pixel pattern enables expansion of a spectroscopic mosaic set beyond the standard RGB and CMYK patterns currently used in filtering systems for cameras and other optics. The expanded mosaic pattern may include filter particles such as upconverting phosphors that absorb light in the near-IR and transmit in the visible, or may include nanoparticles of PbSe which may absorb certain spectroscopic regions of NIR and SWIR. Furthermore, array dimensions may not be square or symmetric, for example a repeated 2×3, 2×4, 2×5, 2×7, 2×10, 2×17, 2×51, 2×200, 2×1000, 3×4, 3×9, 3×300, 10×100 may be created. Furthermore, array dimensions need not be rectangular. Polygonal e.g., hexagonal or octagonal unit cells, or other irregularly shaped or elongated unit cell can be used to create filter particle arrays using the method of the invention. In all embodiments, higher spectral definition, higher color fidelity, and higher resolution of a spectroscopically richer set of closely matched wavelengths of light is provided. High spectral definition is important in applications such as laser threat detection or biological sample staining, for example.

A non-limiting example of a means for detecting filtered light is a color-imaging detector or color camera. Color-imaging detector as used herein refers to any component, portion thereof, or system of components that can detect colored light. Non-limiting examples of color-imaging detectors can be found, for example in U.S. Publication No. 2006/0252070. In aspects of the invention, a color-imaging detector may be positioned for detecting filtered light, for example, beneath a color filter array or on a side of the color filter array. In another aspect of the invention, the substrate of a filter particle array comprises a color imaging detector. The methods described in the invention are not limited to filtering of color or visible light. Filter particle arrays composed of requisite selective infrared absorbing regions can be fabricated on focal plane arrays. Infrared focal plane arrays are manufactured for different regions of the infrared ranging from NIR to LWIR. Infrared focal plane arrays are commercially available (e.g., Goodrich; Princeton, N.J., USA and FLIR Systems Inc.; Boston, Mass., USA).

It is understood that modifications to the invention may be made as might occur to one skilled in the field of the invention within the scope of the appended claims. All embodiments contemplated hereunder which achieve the objects of the invention have not been shown in complete detail. Other embodiments may be developed without departing from the spirit of the invention or from the scope of the appended claims. Although the present invention has been described with respect to specific details, it is not intended that such details should be regarded as limitations on the scope of the invention, except to the extent that they are included in the accompanying claims.

We claim:

1. An imaging system for electromagnetic radiation, comprising:
   (1) a photodetector array; and
   (2) a microarray on a substrate comprising a plurality of addressable regions, each addressable region having a first layer comprising:
      (a) a first nucleic acid moiety attached to the substrate; and
      (b) a first plurality of filter particles having attached thereto a second nucleic acid moiety capable of hybridizing to the first nucleic acid moiety on a selected addressable region of the microarray; and
   wherein at least one addressable region further comprises a second layer comprising:
   a second plurality of filter particles having attached thereto a third nucleic acid moiety capable of hybridizing to the second nucleic acid moiety; and
   wherein the layers of filter particles in at least two addressable regions are configured to allow passage of different selected wavelengths of electromagnetic radiation through the filter particles; and
   wherein the photodetector array is configured to detect at least one wavelength of electromagnetic radiation that has passed through the filter particles.

2. The imaging system of claim 1 wherein the substrate is a surface of the photodetector array.

3. The imaging system of claim 1 wherein the substrate is a plate transparent to the electromagnetic radiation being detected and the microarray is in registration with the photodetector array.

4. The imaging system of claim 1 wherein the substrate consists of a transfer stamp.

5. The imaging system of claim 1 wherein the nucleic acid moieties comprise DNA or RNA.

6. The imaging system of claim 1 wherein the filter particles in at least one addressable region are core-dyed microspheres.

7. The imaging system of claim 1 wherein the filter particles in at least one addressable region are microparticle- or nanoparticle-impregnated microspheres.

8. The imaging system of claim 1 wherein the filter particles in at least one addressable region are microparticles or nanoparticles.

9. The imaging system of claim 1 wherein the filter particles in at least one addressable region comprise a pigment or a phosphor for upconverting infrared electromagnetic radiation.

10. The imaging system of claim 1 wherein the filter particles in at least one addressable region comprise a molecular structure that can be vibrationally excited with different wavelengths of infrared radiation.

11. The imaging system of claim 1 further comprising a linking layer between the filter particles and the photodetector array.

12. The imaging system of claim 1 further comprising an intermediate layer on the photodetector array.

13. The imaging system of claim 1 further comprising an outermost layer over the filter particles having an index of refraction selected to decrease scattering of electromagnetic radiation.

14. The imaging system of claim 1 wherein the microarray is in a 2×2 pixel pattern.

15. The imaging system of claim 1 wherein the microarray is in an N×N pixel pattern, where N is greater than 2.

16. The imaging system of claim 1 wherein at least a portion of the microarray is in an N×M pixel pattern, where M is not equal to N.

17. The imaging system of claim 1 wherein at least a portion of the microarray is in a pixel pattern that is not rectangular.

18. A method for making an imaging system of claim 1, comprising:
   (a) providing a substrate comprising selected regions and a surface;
   (b) attaching selected first nucleic acids to selected regions of the surface to form a microarray comprising addressable regions;
   (c) exposing the microarray to a first plurality of filter particles having attached thereto complementary second nucleic acids selected to bind with the first nucleic acids in selected addressable regions of the microarray to form a first layer of filter particles;
   (d) exposing the microarray from step (c) to a second plurality of filter particles having attached thereto complementary third nucleic acids selected to bind with the second nucleic acids attached to the first layer of filter particles in at least one selected addressable region of the nucleic acid array to form a second layer of filter particles; and (e) placing the microarray from step (d) over a photodetector array such that the microarray is in registration with selected regions of the photodetector array.

19. The method of claim 18 further comprising applying a refractive index-matching layer.

20. A method for making an imaging system of claim 1, comprising:
    (a) providing a substrate comprising a photodetector array having a surface with selected regions;
    (b) attaching selected first nucleic acids to selected regions of the surface to form a photodetector array comprising addressable regions;
    (c) exposing the photodetector array of step (b) to a first plurality of filter particles having attached thereto complementary second nucleic acids selected to bind with the first nucleic acids in selected addressable regions of the photodetector array to form a first layer of filter particles; and
    (d) exposing the photodetector array from step (c) to a second plurality of filter particles having attached thereto complementary third nucleic acids selected to bind with the second nucleic acids attached to the first layer of filter particles in at least one selected addressable region of the nucleic acid array to form a second layer of filter particles.

21. The method of claim 20 further comprising applying a refractive index-matching layer.

22. A method for making an imaging system of claim 1, comprising:
    (a) providing a photodetector array comprising sensor elements;
    (b) providing a transfer stamp comprising a surface;
    (c) attaching selected first nucleic acids to selected regions of the surface to form a microarray comprising addressable regions;
    (d) exposing the microarray on the stamp to a first plurality of filter particles having attached thereto complementary second nucleic acids selected to bind with the first nucleic acids in selected addressable region of the microarray to form a first layer of filter particles;
    (e) exposing the microarray from step (d) to a second plurality of filter particles having attached thereto complementary third nucleic acids selected to bind with the second nucleic acids attached to the first plurality of filter particles in at least one selected addressable region of the nucleic acid array to form a second layer of filter particles; and
    (f) applying the stamp to the photodetector array in registration with selected sensor elements.

23. The method of claim 22 further comprising removing the stamp from the photodetector array and leaving the filter particles on the photodetector.

24. The method of claim 22 wherein the photodetector array further comprises a linking layer.

25. The method of claim 22 further comprising applying a refractive index-matching layer.

* * * * *